(12) United States Patent
Resnick et al.

(10) Patent No.: US 8,556,616 B2
(45) Date of Patent: Oct. 15, 2013

(54) TEMPLATE HAVING A VARYING THICKNESS TO FACILITATE EXPELLING A GAS POSITIONED BETWEEN A SUBSTRATE AND THE TEMPLATE

(75) Inventors: Douglas J. Resnick, Leander, TX (US); Mario Johannes Meissl, Austin, TX (US); Byung-Jin Choi, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 3 days.

(21) Appl. No.: 13/073,533

(22) Filed: Mar. 28, 2011

(65) Prior Publication Data
US 2011/0171340 A1   Jul. 14, 2011

Related U.S. Application Data

(63) Continuation of application No. 12/838,852, filed on Jul. 19, 2010, now abandoned, which is a continuation of application No. 11/744,698, filed on May 4, 2007, now abandoned.

(60) Provisional application No. 60/799,496, filed on May 11, 2006.

(51) Int. Cl.
*B29C 59/02* (2006.01)

(52) U.S. Cl.
USPC ........ 425/385; 425/387.1; 425/394; 425/403; 425/405.1; 425/470

(58) Field of Classification Search
USPC .............. 425/385, 387.1, 389, 394, 400, 403, 425/403.1, 405.1, 470
See application file for complete search history.

(56) References Cited

U.S. PATENT DOCUMENTS

| | | |
|---|---|---|
| 2,975,476 A | 3/1961 | Burke |
| 3,130,412 A | 4/1964 | Fox et al. |
| 3,945,790 A | 3/1976 | Puech |
| 3,946,367 A | 3/1976 | Wohlmut et al. |
| 4,233,261 A | 11/1980 | Mijnheer |
| 4,312,823 A | 1/1982 | Kraakman |
| 4,329,308 A | 5/1982 | Langer et al. |
| 4,395,211 A | 7/1983 | Broeksema et al. |
| 4,514,249 A | 4/1985 | Reed |
| 4,601,861 A | 7/1986 | Pricone et al. |
| 4,723,903 A | 2/1988 | Okazaki et al. |

(Continued)

FOREIGN PATENT DOCUMENTS

DE   10130392 A1   1/2003

*Primary Examiner* — Dimple Bodawala
(74) *Attorney, Agent, or Firm* — Cameron A. King

(57) ABSTRACT

A nanoimprint lithography template including, inter alia, a body having first and second opposed sides with a first surface disposed on the first side, the second side having a recess disposed therein, the body having first and second regions with the second region surrounding the first region and the recess in superimposition with the first region, with a portion of the first surface in superimposition with the first region being spaced-apart from the second side a first distance and a portion of the first surface in superimposition with the second region being spaced-apart from the second side a second distance, with the second distance being greater than the first distance; and a mold disposed on the first side of the body in superimposition a portion of the first region.

6 Claims, 13 Drawing Sheets

(56) References Cited

U.S. PATENT DOCUMENTS

| | | | |
|---|---|---|---|
| 5,348,616 A | 9/1994 | Hartman et al. | |
| 5,427,599 A | 6/1995 | Greschner et al. | |
| 5,464,711 A | 11/1995 | Mogab et al. | |
| 5,509,041 A | 4/1996 | Resnick et al. | |
| 5,621,594 A | 4/1997 | Gray et al. | |
| 5,669,303 A | 9/1997 | Maracas et al. | |
| 5,684,660 A | 11/1997 | Gray et al. | |
| 5,699,848 A | 12/1997 | Lee et al. | |
| 5,804,017 A | 9/1998 | Hector | |
| 5,876,454 A * | 3/1999 | Nanci et al. | 424/423 |
| 6,270,611 B1 | 8/2001 | Ohki et al. | |
| 6,305,925 B1 | 10/2001 | Cassani | |
| 6,309,580 B1 | 10/2001 | Chou | |
| 6,335,775 B1 | 1/2002 | Iwamura et al. | |
| 6,368,752 B1 | 4/2002 | Dauksher et al. | |
| 6,482,742 B1 | 11/2002 | Chou | |
| 6,659,759 B2 | 12/2003 | Anzai et al. | |
| 6,696,220 B2 | 2/2004 | Bailey et al. | |
| 6,873,087 B1 | 3/2005 | Choi et al. | |
| 6,900,881 B2 | 5/2005 | Sreenivasan et al. | |
| 6,916,584 B2 | 7/2005 | Sreenivasan et al. | |
| 6,919,152 B2 | 7/2005 | Sreenivasan et al. | |
| 6,936,194 B2 | 8/2005 | Watts | |
| 6,982,783 B2 | 1/2006 | Choi et al. | |
| 6,986,975 B2 | 1/2006 | Sreenivasan et al. | |
| 7,018,572 B2 * | 3/2006 | Feist et al. | 264/1.33 |
| 7,019,819 B2 | 3/2006 | Choi et al. | |
| 7,027,156 B2 | 4/2006 | Watts et al. | |
| 7,029,944 B1 | 4/2006 | Conley et al. | |
| 7,037,639 B2 | 5/2006 | Voisin | |
| 7,041,604 B2 | 5/2006 | Miller et al. | |
| 7,070,405 B2 | 7/2006 | Sreenivasan et al. | |
| 7,077,992 B2 | 7/2006 | Sreenivasan et al. | |
| 7,136,150 B2 | 11/2006 | Sreenivasan et al. | |
| 7,150,622 B2 | 12/2006 | Choi et al. | |
| 7,179,079 B2 | 2/2007 | Sreenivasan et al. | |
| 7,224,443 B2 * | 5/2007 | Choi et al. | 355/75 |
| 7,229,273 B2 | 6/2007 | Bailey et al. | |
| 7,270,533 B2 * | 9/2007 | McMackin et al. | 425/387.1 |
| 7,281,921 B2 | 10/2007 | Watts et al. | |
| 7,309,225 B2 | 12/2007 | McMackin et al. | |
| 7,316,554 B2 * | 1/2008 | Choi et al. | 425/210 |
| 7,531,025 B2 * | 5/2009 | McMackin et al. | 95/246 |
| 7,635,445 B2 | 12/2009 | Choi et al. | |
| 7,636,999 B2 | 12/2009 | Choi et al. | |
| 7,691,313 B2 | 4/2010 | Choi et al. | |
| 7,798,801 B2 | 9/2010 | Babbs et al. | |
| 8,192,637 B2 * | 6/2012 | Washiya et al. | 216/22 |
| 2002/0159918 A1 | 10/2002 | Tseng et al. | |
| 2003/0099736 A1 | 5/2003 | Anzai et al. | |
| 2003/0189273 A1 | 10/2003 | Olsson | |
| 2004/0065252 A1 | 4/2004 | Sreenivasan et al. | |
| 2004/0065976 A1 | 4/2004 | Sreenivasan et al. | |
| 2004/0132301 A1 * | 7/2004 | Harper et al. | 438/689 |
| 2004/0163563 A1 | 8/2004 | Sreenivasan et al. | |
| 2004/0197712 A1 | 10/2004 | Jacobson et al. | |
| 2004/0219249 A1 | 11/2004 | Chung et al. | |
| 2005/0006343 A1 * | 1/2005 | Choi et al. | 216/59 |
| 2005/0028618 A1 * | 2/2005 | Chol et al. | 73/865.9 |
| 2005/0064344 A1 | 3/2005 | Bailey et al. | |
| 2005/0084804 A1 | 4/2005 | Truskett et al. | |
| 2005/0133954 A1 * | 6/2005 | Homola | 264/219 |
| 2005/0185169 A1 | 8/2005 | McMackin et al. | |
| 2005/0189676 A1 | 9/2005 | Sreenivasan | |
| 2005/0208171 A1 | 9/2005 | Seki et al. | |
| 2005/0230882 A1 | 10/2005 | Watts et al. | |
| 2005/0266587 A1 | 12/2005 | Nimmakayala et al. | |
| 2005/0276919 A1 | 12/2005 | Truskett et al. | |
| 2006/0077374 A1 | 4/2006 | Sreenivasan et al. | |
| 2006/0113697 A1 | 6/2006 | Sreenivasan | |
| 2006/0172549 A1 * | 8/2006 | Choi et al. | 438/758 |
| 2007/0114686 A1 * | 5/2007 | Choi et al. | 264/2.7 |
| 2007/0122942 A1 | 5/2007 | Sreenivasan et al. | |
| 2007/0228589 A1 * | 10/2007 | Choi et al. | 264/39 |
| 2007/0237886 A1 | 10/2007 | Dijksman et al. | |
| 2007/0278712 A1 | 12/2007 | Okushima | |
| 2008/0095878 A1 | 4/2008 | Bailey et al. | |
| 2008/0160129 A1 | 7/2008 | Resnick et al. | |
| 2009/0130598 A1 | 5/2009 | Schmid et al. | |
| 2009/0140458 A1 | 6/2009 | Xu et al. | |
| 2009/0166933 A1 | 7/2009 | Sreenivasan | |
| 2009/0197057 A1 | 8/2009 | Xu | |
| 2009/0208882 A1 * | 8/2009 | Schmid et al. | 430/324 |
| 2009/0212012 A1 | 8/2009 | Brooks et al. | |
| 2009/0243153 A1 * | 10/2009 | Sreenivasan et al. | 264/293 |
| 2010/0015270 A1 * | 1/2010 | Choi et al. | 425/149 |
| 2010/0173034 A1 | 7/2010 | Sreenivasan | |
| 2010/0255139 A1 * | 10/2010 | Washiya et al. | 425/405.1 |
| 2011/0084417 A1 * | 4/2011 | Choi et al. | 264/40.5 |
| 2011/0140304 A1 * | 6/2011 | Choi et al. | 264/293 |
| 2011/0272838 A1 * | 11/2011 | Malloy et al. | 264/39 |

* cited by examiner

TEMPLATE HAVING A VARYING THICKNESS TO FACILITATE EXPELLING A GAS POSITIONED BETWEEN A SUBSTRATE AND THE TEMPLATE

CROSS-REFERENCE TO RELATED APPLICATIONS

The present application is a continuation of U.S. patent application Ser. No. 12/838,852 filed Jul. 19, 2010, now abandoned, which is a continuation of U.S. patent application Ser. No. 11/744,698 filed May 4, 2007, now abandoned, which claims priority to U.S. provisional application No. 60/799,496 filed on May 11, 2006. Each of the aforementioned patent applications is incorporated herein by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent publication no. 2004/0065976 filed as U.S. patent application Ser. No. 10/264,960, entitled "Method and a Mold to Arrange Features on a Substrate to Replicate Features having Minimal Dimensional Variability"; U.S. patent publication no. 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and are incorporated herein by reference.

The imprint lithography technique disclosed in each of the aforementioned U.S. patent publications and U.S. patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
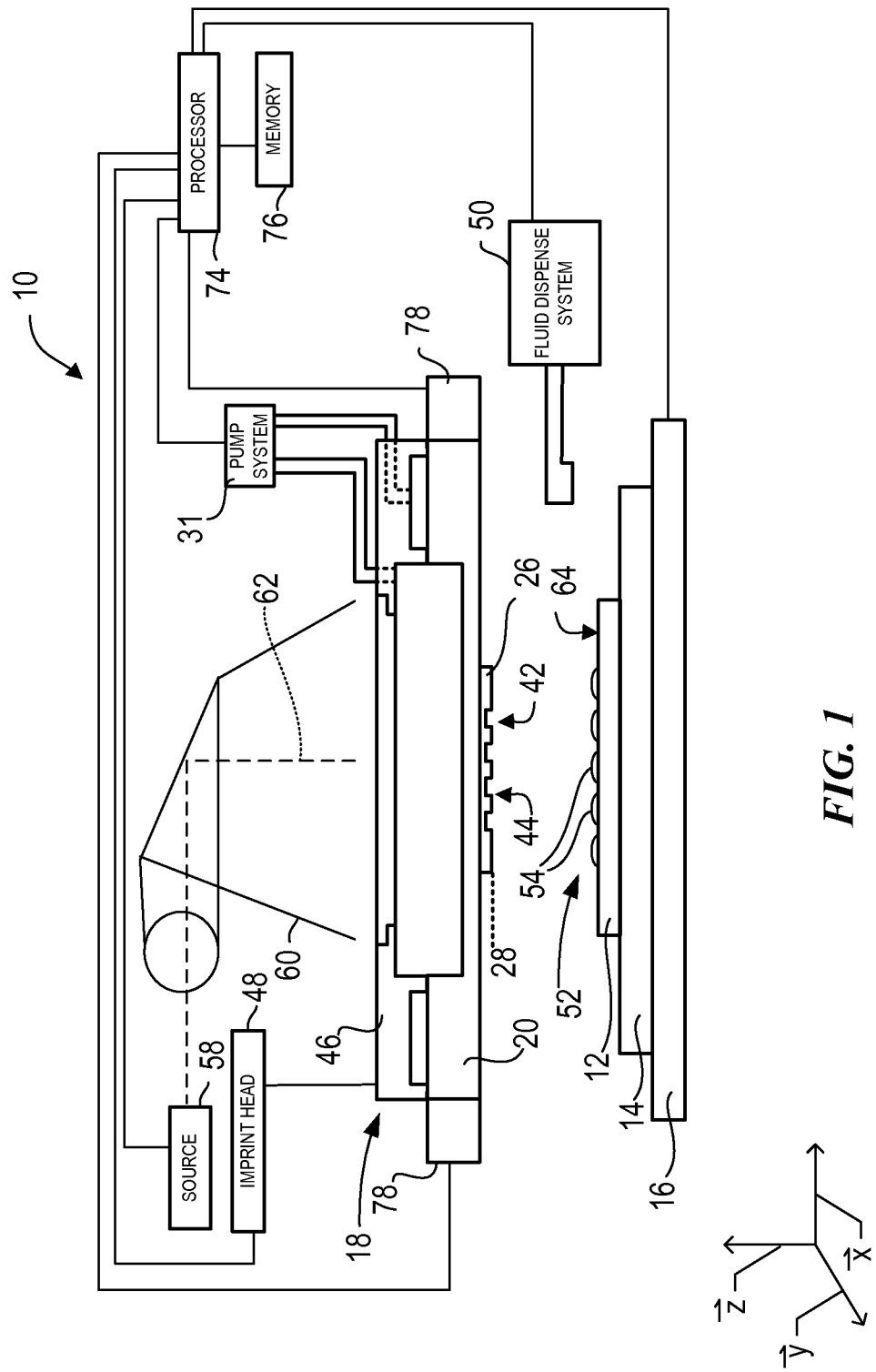
FIG. 1 is a cross-sectional view of a lithographic system having a patterning device spaced-apart from a substrate.

Referring to FIG. 1, a system 10 to form a relief pattern on a substrate 12 is shown. Substrate 12 may be coupled to a substrate chuck 14. Substrate 12 and substrate chuck 14 may be supported upon a stage 16. Further, stage 16, substrate 12, and substrate chuck 14 may be positioned on a base (not shown). Stage 16 may provide motion about the x and y axes. Substrate chuck 12 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference.

Figure 2:
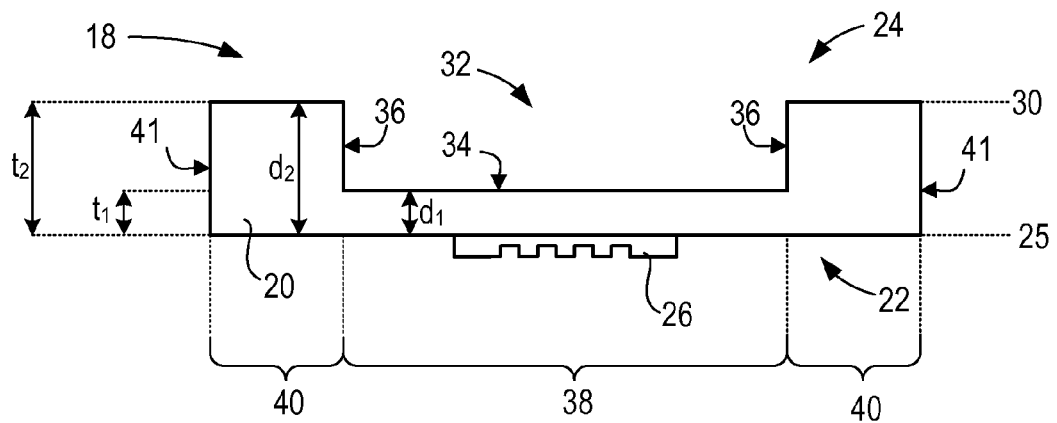
FIG. 2 is a cross-sectional view of the patterning device shown in FIG. 1.
Figure 3:
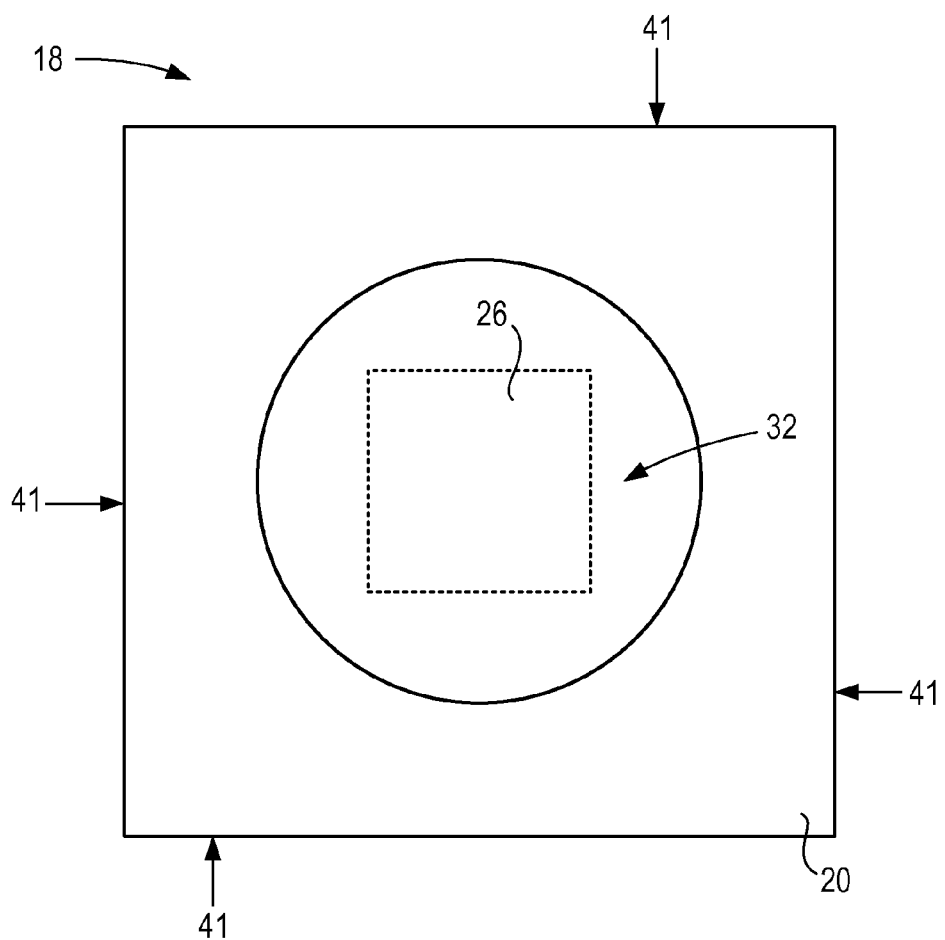
FIG. 3 is a top down view of the patterning device shown in FIG. 2.
Figure 4:
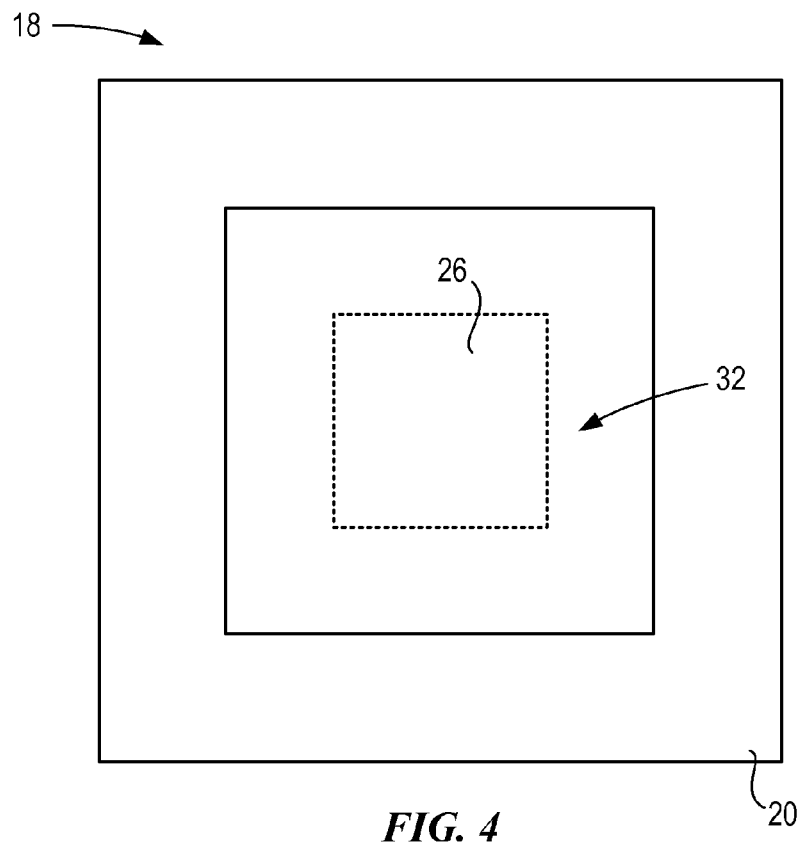
FIG. 4 is a top down view of the patterning device shown in FIG. 2, in a second embodiment.
Figure 5:
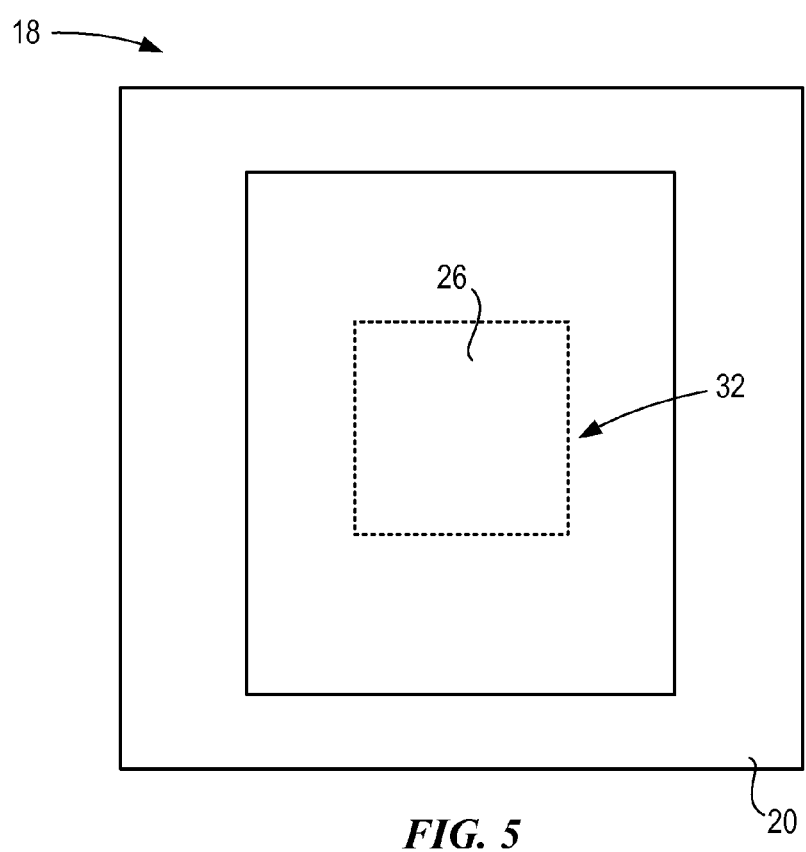
FIG. 5 is a top down view of the patterning device shown in FIG. 2, in a third embodiment.
Figure 6:
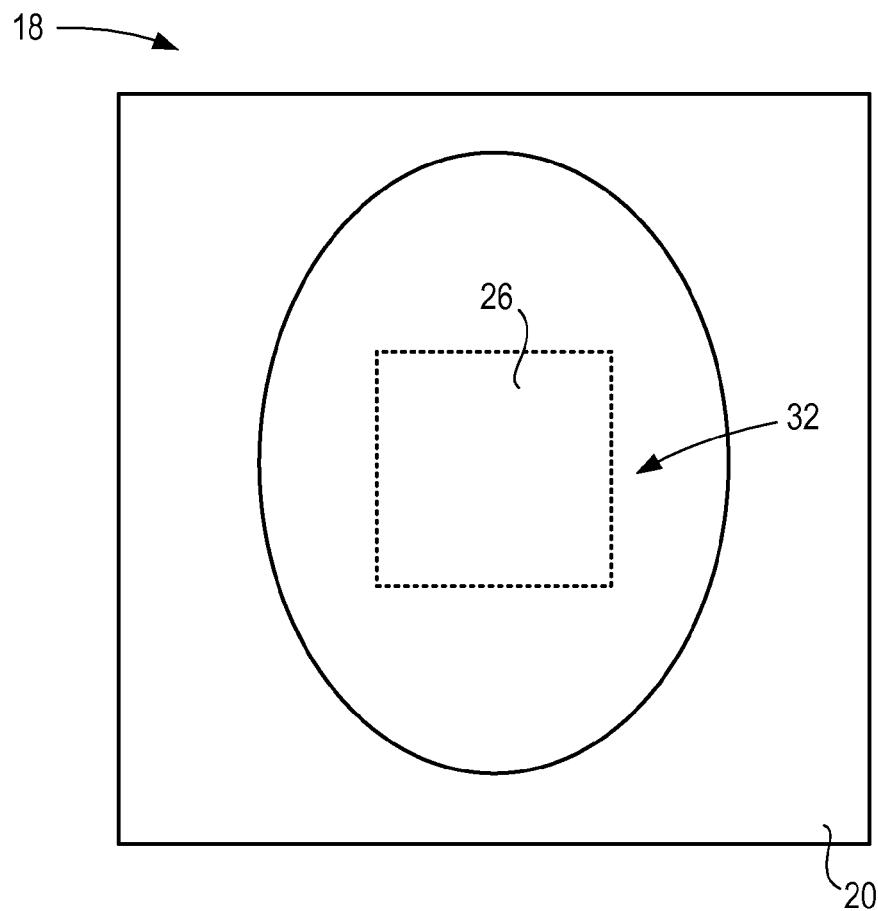
FIG. 6 is a top down view of the patterning device shown in FIG. 2, in a fourth embodiment.

Referring to FIGS. 1-3, spaced-apart from substrate 12 is a patterning device 18. Patterning device 18 comprises a template 20 having first and second sides 22 and 24. First side may have a first surface 25 positioned thereon and extending therefrom towards substrate 12 with a patterning surface 28 thereon. First side 22 of template 20 may be substantially planar. Second side 24 of template 20 may have a second surface 30 and a recess 32 disposed therein. Recess 32 may comprise a nadir surface 34 and a boundary surface 36, with boundary surface 36 extending transversely between nadir surface 34 and second surface 30. Recess 32 may have a circular shape associated therewith, however, recess may have any geometric shape associated therewith. More specifically, recess 32 may have a square shape, as shown in FIG. 4; a rectangular shape, as shown in FIG. 5; or an elliptical shape as shown in FIG. 6.

Template 20 may further comprises a first region 38 and a second region 40, with second region 40 surrounding first region 38 and second region 40 having a perimeter 41. First region 38 may be in superimposition with recess 32. To that end, template 20 may have a varying thickness with respect to first and second regions 38 and 40. More specifically, a portion of first surface 25 in superimposition with first region 38 may be spaced-apart from second side 24 a first distance $d_1$ defining a first thickness $t_1$ and a portion of first surface 25 in superimposition with second region 40 may be spaced-apart from second side 24 a second distance $d_2$, defining a second thickness $t_2$. Distance $d_2$ may be greater than distance $d_1$ and thickness $t_2$ may be greater than thickness $t_1$. In an example, distance $d_2$ may have a magnitude of approximately 0.25 inches and distance $d_1$ may have a magnitude of approximately 700 microns. In a further example, distance $d_1$ may have a magnitude in a range of 1 micron to 0.25 inches.

Mesa 26 may be referred to as a mold 26. Mesa 26 may also be referred to as a nanoimprint mold 26. In a further embodiment, template 20 may be substantially absent of mold 26. Template 20 and/or mold 26 may be formed from such materials including, but not limited to, fused-silica, quartz, silicon, organic polymers, siloxane polymers, borosilicate glass, fluorocarbon polymers, metal, and hardened sapphire. As shown, patterning surface 28 comprises features defined by a plurality of spaced-apart recesses 42 and protrusions 44. However, in a further embodiment, patterning surface 28 may be substantially smooth and/or planar. Patterning surface 28 may define an original pattern that forms the basis of a pattern to be formed on substrate 12. Further, mold 26 may be in superimposition with a portion of first region 38, however, in a further embodiment, mold 26 may be in superimposition with an entirety of first region 38.

Figure 7:
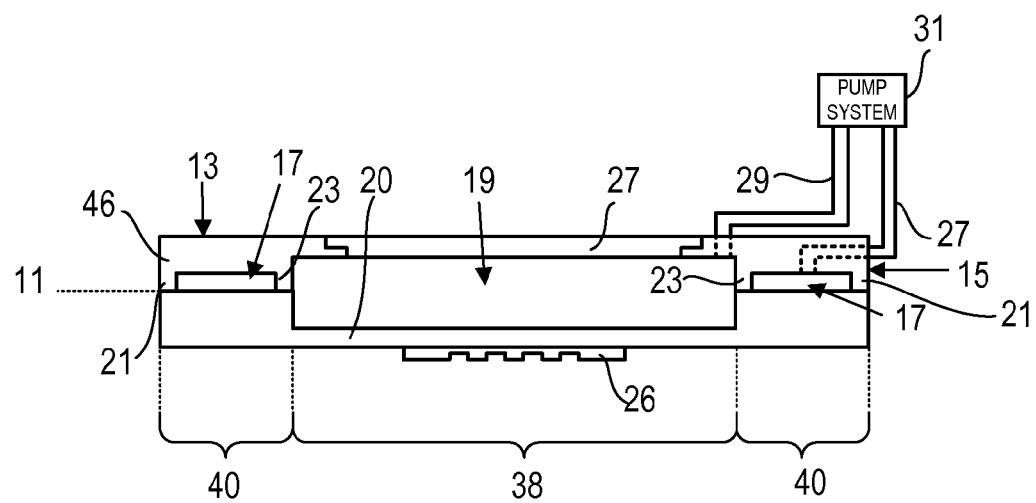
FIG. 7 is a cross-sectional view of the patterning device and the template chuck, both shown in FIG. 1.
Figure 8:
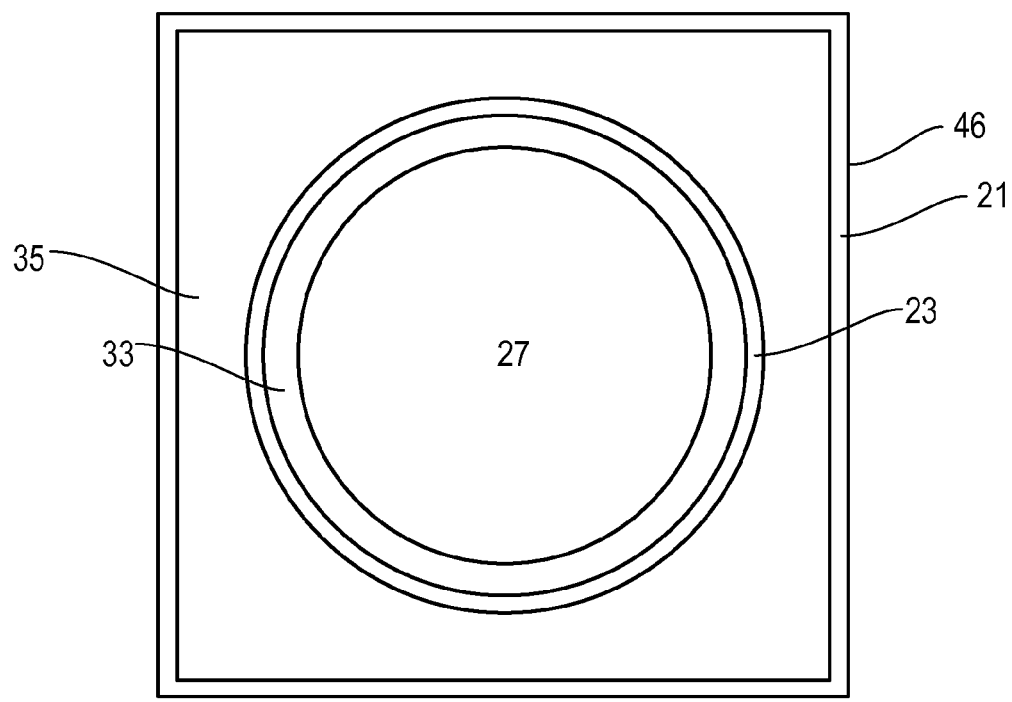
FIG. 8 is a bottom-up plan view of the template chuck shown in FIG. 7.

Referring to FIGS. 1, 7, and 8, template 20 may be coupled to a template chuck 46, template chuck 46 being any chuck including, but not limited to, vacuum, pin-type, groove-type, or electromagnetic, as described in U.S. Pat. No. 6,873,087. Template chuck 46 includes first 11 and second 13 opposed sides. A side, or edge, surface 15 extends between first side 11 and second side 13. First side 11 includes a first recess 17 and a second recess 19, spaced-apart from first recess 17, defining first 21 and second 23 spaced-apart support regions. First support region 21 cinctures second support region 23 and first 17 and second 19 recesses. Second support region 23 cinctures second recess 19. In a further embodiment, first and second support regions 21 and 23 may be formed from a compliant material. First support region 21 may have a square shape and second support region 23 may have a circular shape; however, in a further embodiment, first and second support regions 21 and 23 may comprise any geometric shape desired. A portion 27 of template chuck 46 in superimposition with second recess 19 may be transparent to radiation having a predetermined wavelength. To that end, portion 27 may be made from a thin layer of transparent material, such as glass. However, the material from which portion 27 is made may depend upon the wavelength of radiation, described further below. Portion 27 extends between second side 13 and terminates proximate to second recess 19 and should define an area at least as large as an area of mold 26 so that mold 26 is in superimposition therewith.

Formed in template chuck 46 are throughways 27 and 29, however, template chuck 46 may comprise any number of throughways. Throughway 27 places first recess 17 in fluid communication with side surface 15, however, in a further embodiment, it should be understood that throughway 27 may place first recess 17 in fluid communication with any surface of template chuck 46. Throughway 29 places second recess 19 in fluid communication with second side 13, however, in a further embodiment, it should be understood that throughway 29 may place second recess 19 in fluid communication with any surface of template chuck 46. Furthermore, what is desired is that throughways 27 and 29 facilitate placing first and second recess 17 and 19, respectively, in fluid communication with a pressure control system, such as a pump system 31.

Pump system 31 may include one or more pumps to control the pressure proximate to first and second recess 17 and 19. To that end, when template 20 is coupled to template chuck 46, template 20 rests against first 21 and second 23 support regions, covering first 17 and second 19 recesses. First region 38 of template 20 may be in superimposition with second recess 19, defining a first chamber 33 and second region 40 template 20 may be in superimposition with first recess 17, defining a second chamber 35. Pump system 31 operates to control a pressure in first and second chambers 33 and 35. Further, template chuck 46 may be coupled to an imprint head 48 to facilitate movement of patterning device 18.

Figure 9:
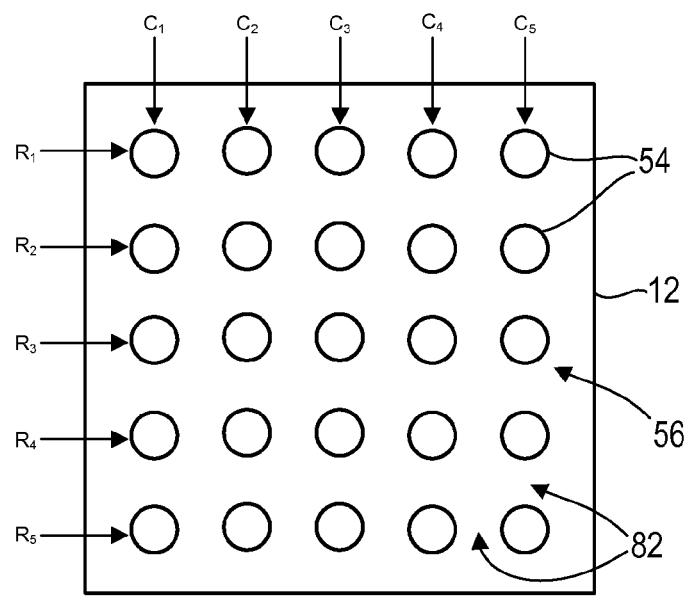
FIG. 9 is a top down view showing an array of droplets of imprinting material positioned upon a region of the substrate shown in FIG. 1.

Referring to FIGS. 1 and 9, system 10 further comprises a fluid dispense system 50. Fluid dispense system 50 may be in fluid communication with substrate 12 so as to deposit polymeric material 52 thereon. System 10 may comprise any number of fluid dispensers, and fluid dispense system 50 may comprise a plurality of dispensing units therein. Polymeric material 52 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymeric material 52 is disposed upon substrate 12 before the desired volume is defined between mold 26 and substrate 12. However, polymeric material 52 may fill the volume after the desired volume has been obtained. As shown in FIG. 9, polymeric material 52 may be deposited upon substrate 12 as a plurality of spaced-apart droplets 54, defining a matrix array 56. In an example, each droplet of droplets 54 may have a unit volume of approximately 1-10 pico-liters. Droplets 54 of matrix array 56 may be arranged in five columns $c_1$-$c_5$ and five rows $r_1$-$r_5$. However, droplets 54 may be arranged in any two-dimensional arrangement on substrate 12.

Figure 10:
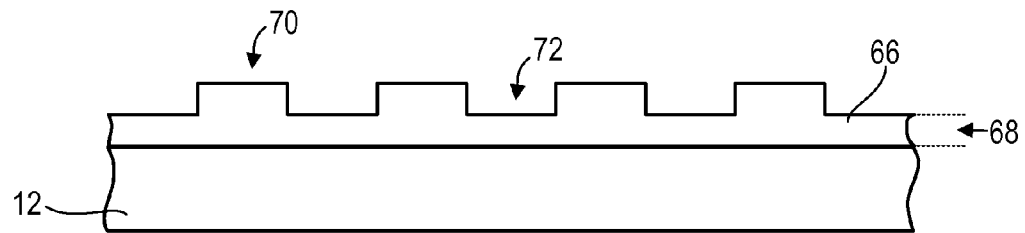
FIG. 10 is a cross-sectional view of the substrate shown in FIG. 1, having a patterned layer thereon.

Referring to FIGS. 1 and 10, system 10 further comprises a source 58 of energy 60 coupled to direct energy 60 along a path 62. Imprint head 48 and stage 16 are configured to arrange mold 26 and substrate 12, respectively, to be in superimposition and disposed in path 62. Either imprint head 48, stage 16, or both vary a distance between mold 26 and substrate 12 to define a desired volume therebetween that is filled by polymeric material 52. After the desired volume is filled with polymeric material 52, source 58 produces energy 60, e.g., broadband ultraviolet radiation that causes polymeric material 52 to solidify and/or cross-link conforming to the shape of a surface 64 of substrate 12 and patterning surface 28, defining a patterned layer 66 on substrate 12. Patterned layer 66 may comprise a residual layer 68 and a plurality of features shown as protrusions 70 and recessions 72. System 10 may be regulated by a processor 74 that is in data communication with stage 16, pump system 31, imprint head 48, fluid dispense system 50, and source 58, operating on a computer readable program stored in memory 76. In a further embodiment, patterned layer 66 may be formed employing any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography.

Figure 11:
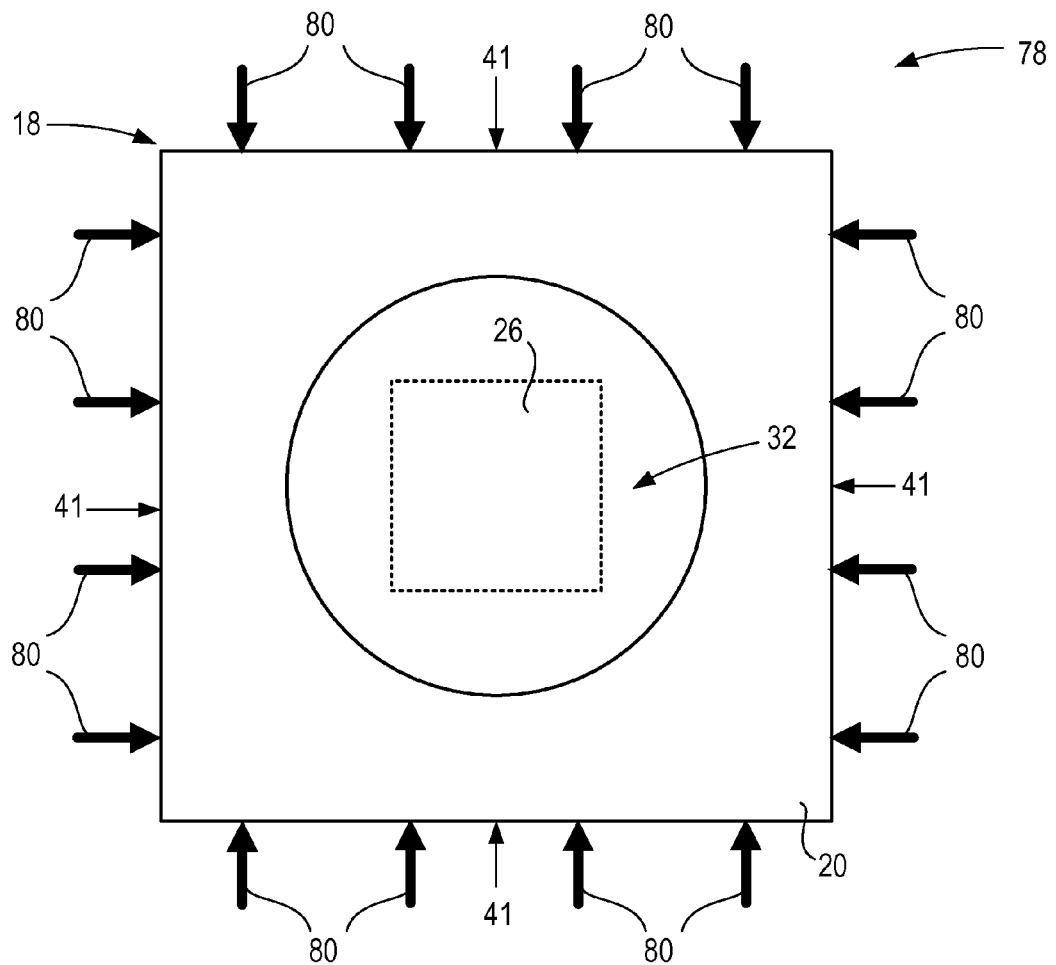
FIG. 11 is a top down view of the patterning device shown in FIG. 1, having an actuation system coupled thereto, in a first embodiment.

Referring to FIGS. 2 and 11, system 10 further comprises an actuator system 78 surrounding patterning device 18. Actuation system 78 includes a plurality of actuators 80 coupled to patterned device 18. Each of actuators 80 are arranged to facilitate generation of a force upon second region 40 of patterning device 18. Actuators 80 may be any force or displacement actuator known in the art including, inter alia, pneumatic, piezoelectric, magnetostrictive, and voice coils.

Figure 12:
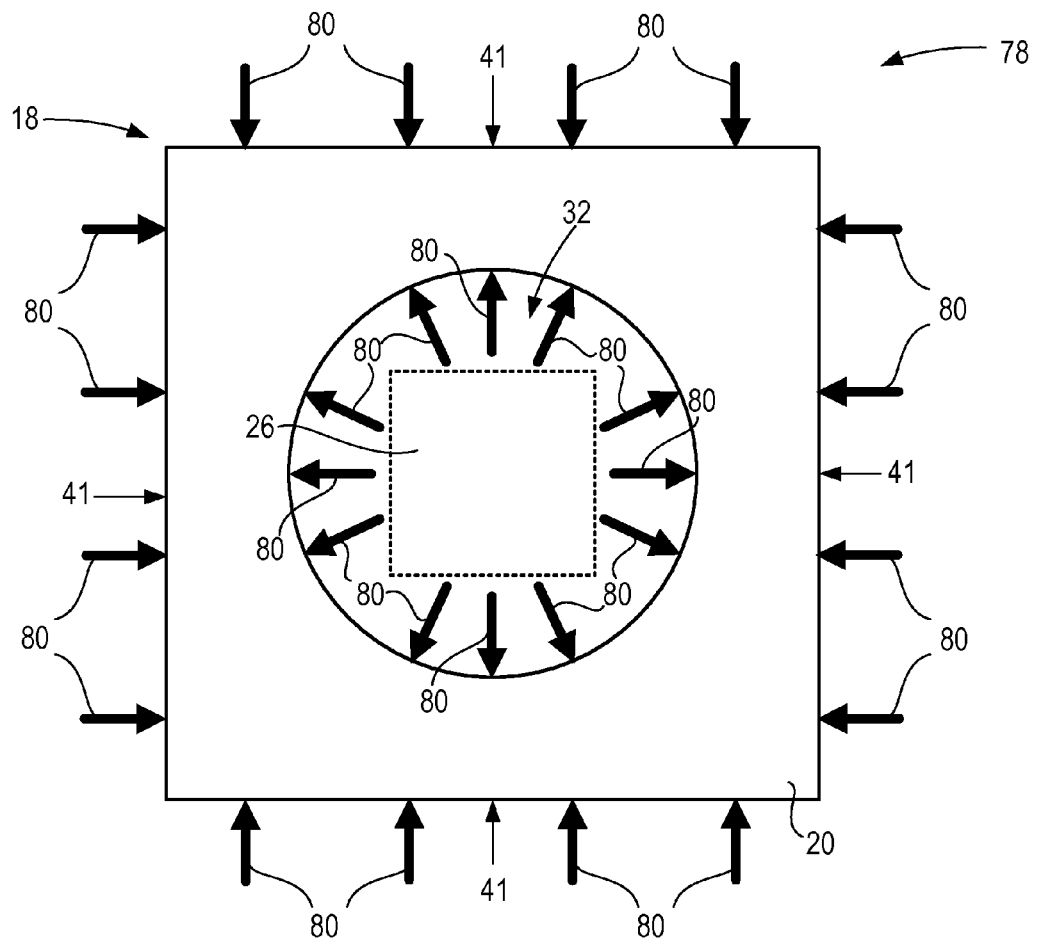
FIG. 12 is a top down view of the patterning device shown in FIG. 1, having an actuation system coupled thereto, in a second embodiment.
Figure 13:
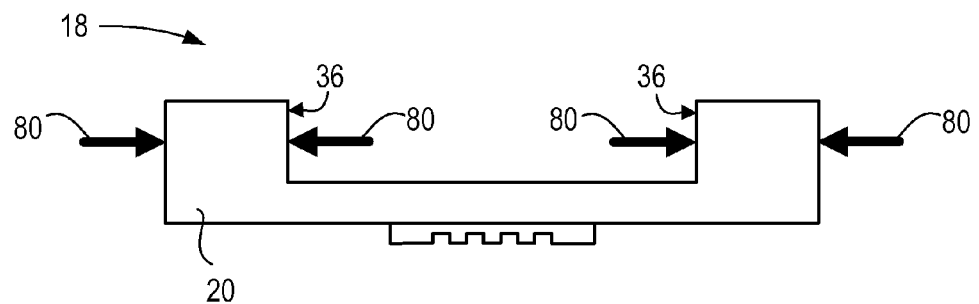
FIG. 13 is a cross-sectional view of the patterning device and actuation system, both shown in FIG. 12.

As shown, actuation system 78 comprises sixteen actuators 80 coupled to a perimeter 41 of patterning device 18, with each side of patterning device 18 having four actuators 80 coupled thereto. However, patterning device 18 may have any number of actuators 80 coupled thereto and may have differing number of actuators 80 coupled to each side of patterning device 18. Patterning device 18 may have any configuration and number of actuators 80 positioned thereon. In a further embodiment, actuators 80 may be coupled to boundary surface 36 of recess 32, as shown in FIGS. 12 and 13. Actuation system 78 may be in data communication with processor 74, operating on a computer readable program stored in memory 76, to control an operation thereof, and more specifically, generate control signals that are transmitted to actuators 80 of actuation system 78.

Referring to FIGS. 1, 9, and 10, as mentioned above, a distance between mold 26 and substrate 12 is varied such that a desired volume is defined therebetween that is filled by polymeric material 52. Furthermore, after solidification, polymeric material 52 conforms to the shape of surface 64 of substrate 12 and patterning surface 28, defining patterned layer 66 on substrate 12. To that end, in a volume 82 defined between droplets 54 of matrix array 56, there are gases present, and droplets 54 in matrix array 56 are spread over substrate 12 so as to avoid, if not prevent, trapping of gases and/or gas pockets between substrate 12 and mold 26 and within patterned layer 66. The gases and/or gas pockets may be such gases including, but not limited to air, nitrogen, carbon dioxide, and helium. Gas and/or gas pockets between substrate 12 and mold 26 and within patterned layer 66 may result in, inter alia, pattern distortion of features formed in patterned layer 66, low fidelity of features formed in patterned layer 66, and a non-uniform thickness of residual layer 48 across patterned layer 68, all of which are undesirable. To that end, a method and a system of minimizing, if not preventing, trapping of gas and/or gas pockets between substrate 12 and mold 26 and within patterned layer 66 are described below.

Figure 14:
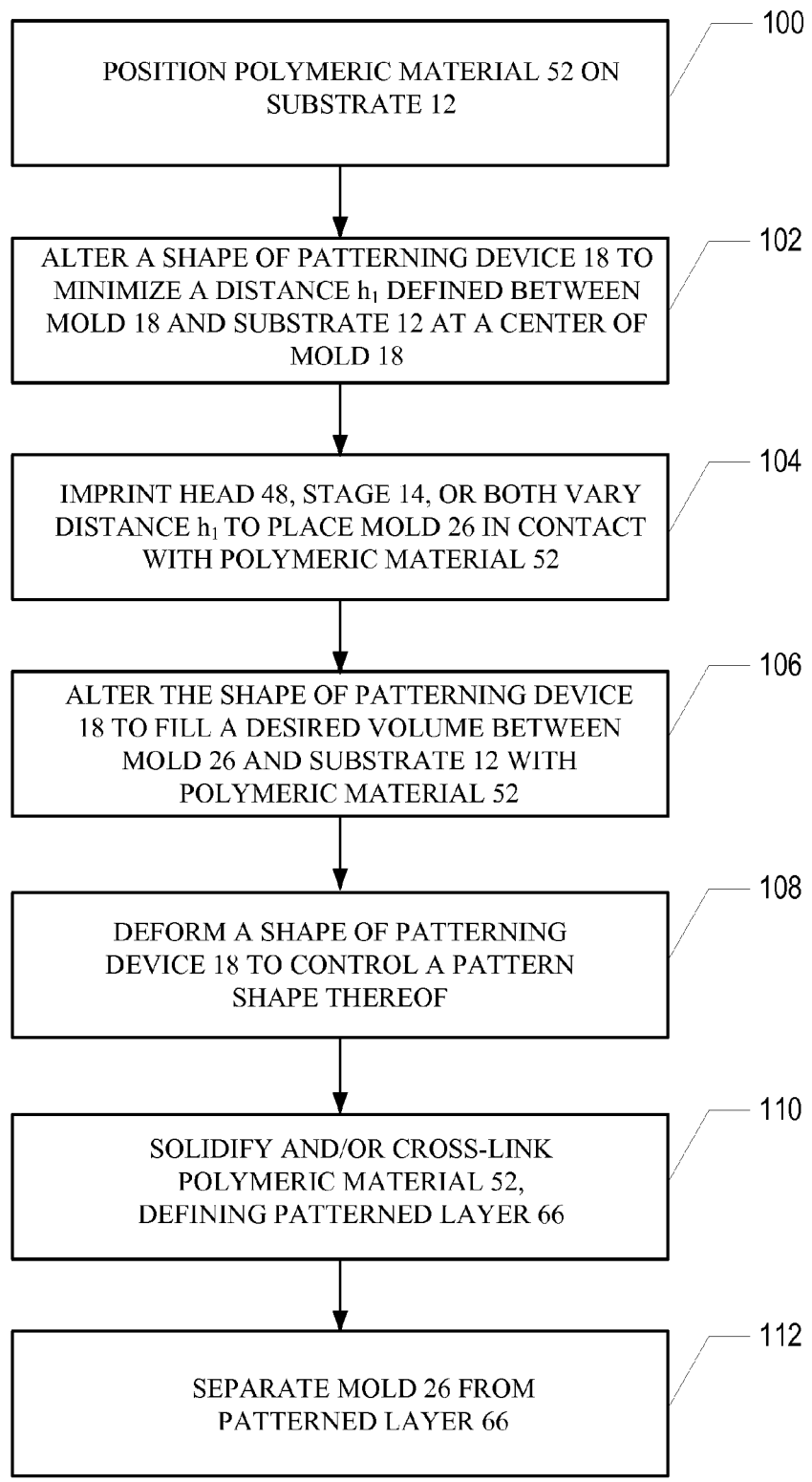
FIG. 14 a flow diagram showing a method of patterning a region of the substrate shown in FIG. 1, in a first embodiment.

Referring to FIGS. 1 and 14, in a first embodiment, a method of expelling gas between substrate 12 and mold 26 is shown. More specifically, at step 100, as mentioned above, polymeric material 52 may be positioned on substrate 12 by drop dispense, spin-coating, dip coating, chemical vapor deposition (CVD), physical vapor deposition (PVD), thin film deposition, thick film deposition, and the like. In a further embodiment, polymeric material 52 may be positioned on mold 26.

Referring to FIGS. 2, 11, 14, and 15, at step 102, a shape of patterning device 18 may be altered such that a distance $h_1$ defined between mold 26 and substrate 12 at a center sub-portion of mold 26 is less than a distance defined between mold 26 and substrate 12 at remaining portions of mold 26. In an example, distance $h_1$ is less than a distance $h_2$, distance $h_2$ being defined at an edge of mold 26. In a further embodiment, the distance $h_1$ may be defined at any desired location of mold 26. The shape of patterning device 18 may be altered by applying a plurality of forces by actuators 80 upon patterning device 18. More specifically, as a result of first region 38 of template 20 having a first thickness $t_1$, upon application of the force by actuators 80, a shape of first region 38 of template 20 may be altered such that first region 38 of template 20 bows toward substrate 12 and away from template chuck 46. Furthermore, each of actuators 80 may exert a differing force upon patterning device 18. In an example, the bowing of first region 38 of template 20 may be on the order of 0-200 nm over 41 mm diameter employing actuators 80.

Referring to FIGS. 2, 7, and 8, in a further embodiment, the shape of patterning device 18 may be altered by controlling a pressure within first and second chambers 33 and 35. More specifically, as mentioned above, pump system 31 operates to control a pressure within first and second chambers 33 and 35. To that end, in a first example, pump system 31 may increase a magnitude of a pressure created within first chamber 33 via throughway 29 such that first region 38 of template 20 may bow away from template chuck 46 and towards substrate 12. In a second example, pump system 31 may create a vacuum within second chamber 35 via throughway 27 such that second region 40 of template 20 may bow away from substrate 12 and bow towards template chuck 46. As a result of bowing second region 40 of template 20 away from substrate 12, first region 38 of template 20 may bow towards substrate 12 and away from template chuck 36, as described in U.S. Pat. No. 7,691,313 entitled "Method for Expelling Gas Positioned Between a Substrate and a Mold" which is incorporated herein by reference. In an example, the bowing of first region 38 of template 20 may be on the order of 0-35 μm nm over 41 mm diameter employing pump system 31. In still a further embodiment, any combination of the methods mentioned above for altering the shape of patterning device 38 may be employed.

Figure 15:
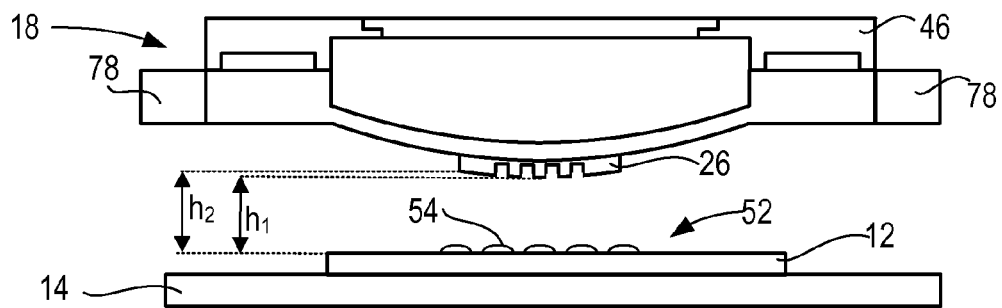
FIG. 15 is a cross-sectional view of the patterning device shown in FIG. 1, with a shape of the patterning device being altered.
Figure 16:
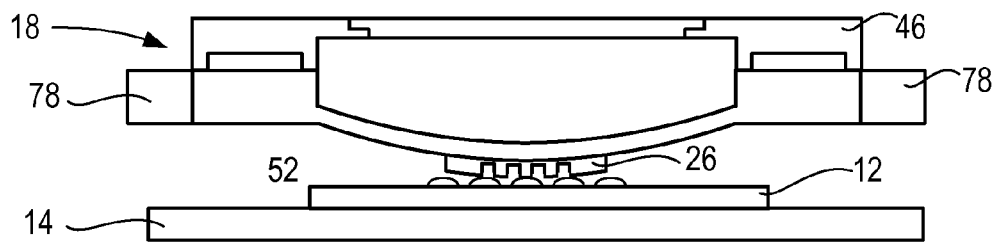
FIG. 16 is a cross-sectional view of the patterning device shown in FIG. 15, in contact with a portion of the droplets of imprinting material shown in FIG. 9.
Figure 17:
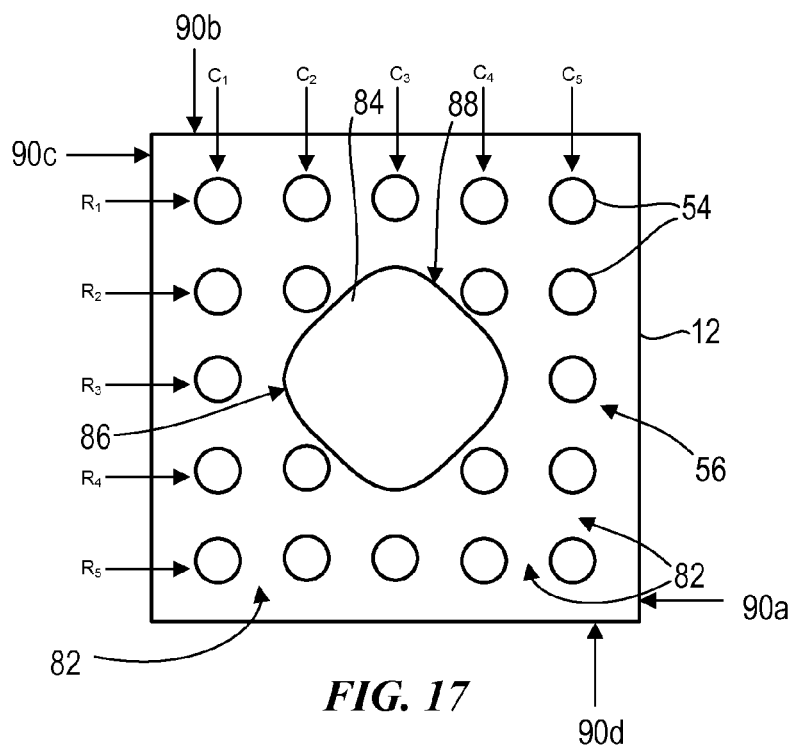
FIGS. 17-20 are top down views showing the compression of the droplets shown in FIG. 9, employing the altered shape of the patterning device shown in FIG. 16.

Referring to FIGS. 14, 16, and 17, at step 104, as described above with respect to FIG. 1, either imprint head 48, shown in FIG. 1, stage 14, or both, may vary distance $h_1$, shown in FIG. 15, such that a sub-portion of mold 26 contacts a sub-portion of droplets 54. As shown, a center sub-portion of mold 26 contacts a sub-portion of droplets 54 prior to the remaining portions of mold 26 contacting the remaining droplets of droplets 54. However, in a further embodiment, any portion of mold 26 may contact droplets 54 prior to remaining portions of mold 26. To that end, this causes droplets 54 to spread and to produce a contiguous liquid sheet 84 of polymeric material 52. Edge 86 of liquid sheet 84 defines a liquid-gas interface 88 that functions to push gases in volume 82 toward edges 90a, 90b, 90c, and 90d of substrate 12. Volume 82 between droplets 54 in columns $c_1$-$c_5$ define gas passages through which gas may be pushed to edges 90a, 90b, 90c, and 90d. As a result, liquid-gas interface 88 in conjunction with the gas passages reduces, if not prevents, trapping of gases in liquid sheet 84.

Figure 18:
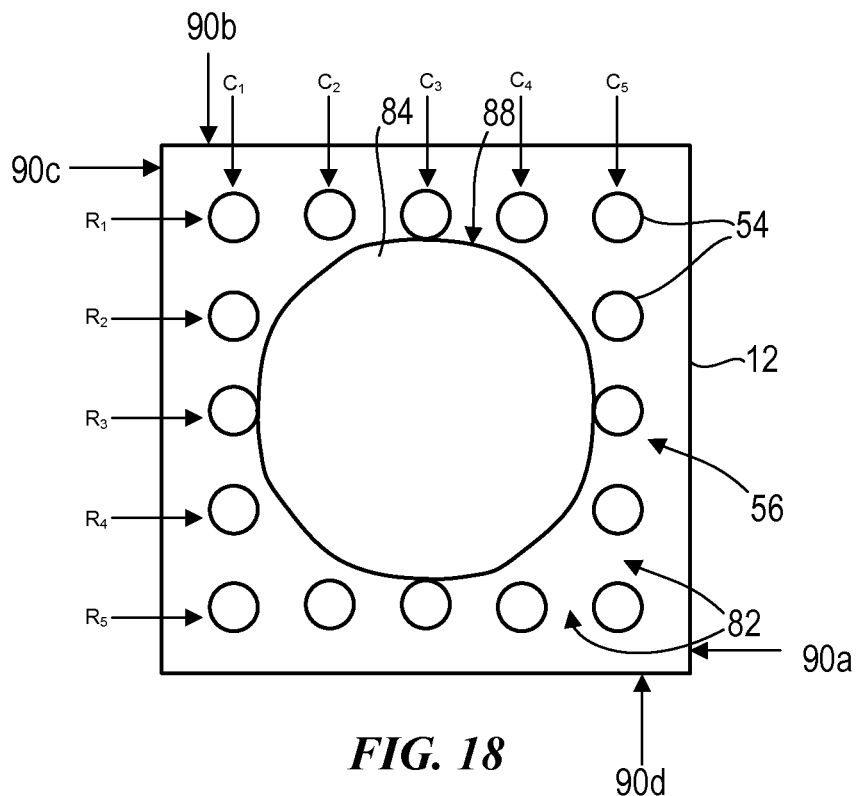
Figure 19:
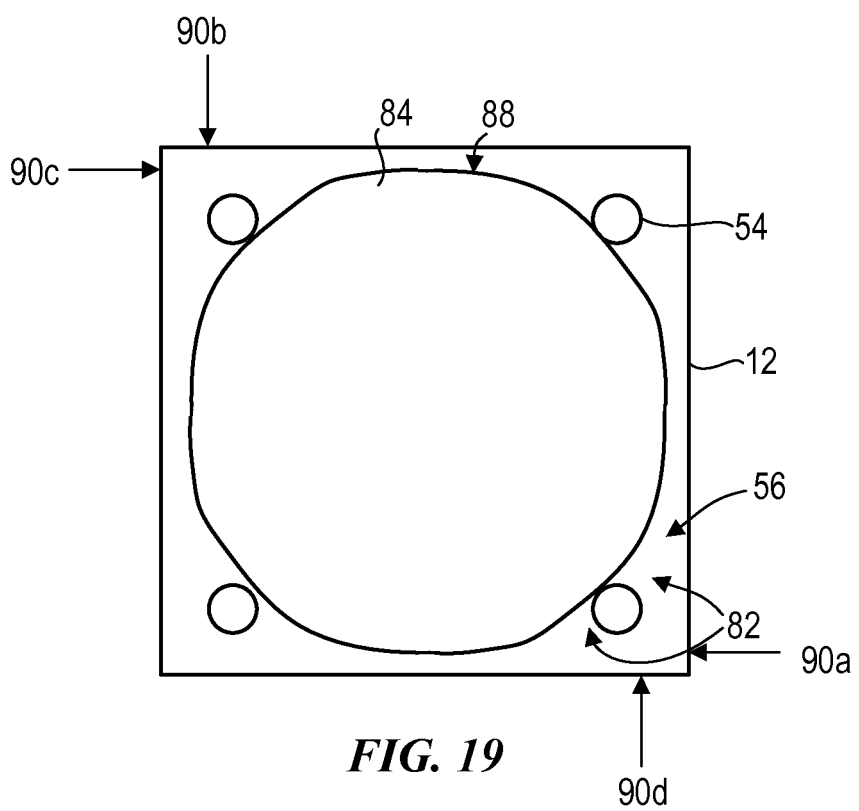
Figure 20:
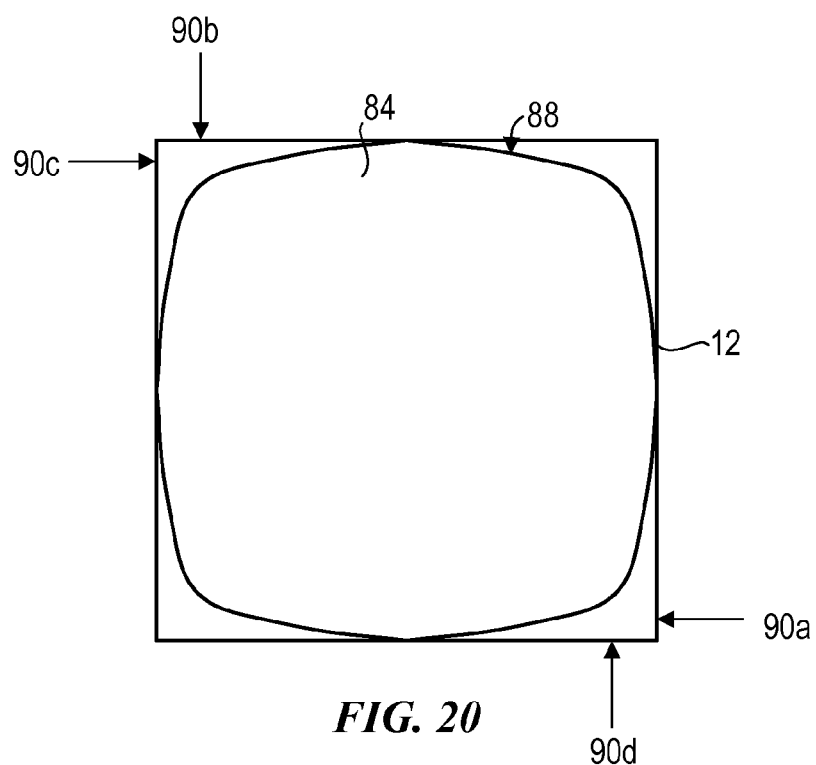

Referring to FIGS. 14 and 16, at step 106, the shape of patterning device 18 may be altered such that the desired volume defined between mold 26 and substrate 12 may be filled by polymeric material 52, as described above with respect to FIG. 1. More specifically, the shape of patterning device 18 may be altered such that polymeric material 52 associated with subsequent subsets of droplets 54, shown in FIG. 18, spread to become included in contiguous fluid sheet 84. The shape of patterning device 18 continues to be altered such that mold 26 subsequently comes into contact with the remaining droplets 54 so that polymeric material 52 associated therewith spreads to become included in contiguous sheet 84, as shown in FIGS. 19 and 20. As can be seen, interface 88 has moved towards edges 90a, 90b, 90c, and 90d so that there is an unimpeded path for the gases in the remaining volume 82, shown in FIG. 17, to travel thereto. This allows gases in volume 82, shown in FIG. 17, to egress from between mold 26 and substrate 12 vis-à-vis edges 90a, 90b, 90c and 90d. In this manner, the trapping of gas and/or gas pockets between substrate 12 and mold 26 and within patterned layer 68, shown in FIG. 10, is minimized, if not prevented. In a further embodiment, the shape of patterning device 18 may be altered concurrently with decreasing the distance $h_1$, as mentioned above with respect to FIG. 15. Furthermore, it may be desired to balance a speed at which polymeric material 52 fills the desired volume between mold 26 and substrate 12. More specifically, if interface 88 propagates towards edges 90a, 90b, 90c, and 90d too fast, pockets of gas may be created between mold 26 and substrate 12, which is undesirable. To that end, in an example, the shape of patterning device 18 may be altered such that polymeric material 52 fills the desired volume between mold 26 and substrate 12 at a speed of 800 mm$^2$ mm in a few seconds.

Referring to FIGS. 11 and 14, at step 108, actuation system 78 may selectively deform patterning device 18. This facilitates correcting various parameters of the pattern shape, i.e., magnification characteristics, skew/orthogonality characteristics, and trapezoidal characteristics. Magnification characteristics may be magnification error, such as where the overall pattern changes from a square shape to a rectangular shape. Skew/orthogonality characteristics may be skew/orthogonality error where adjacent edges form an oblique or obtuse angle with respect to one another instead of an orthogonal angle. Trapezoidal characteristics may be trapezoidal error where as in where a square/rectangular assumes the shape of a trapezium, with trapezium including a trapezoid. To control the pattern shape, patterning device 18 may be selectively deformed by actuators 80 to minimize, if not cancel, the distortions present, thereby reducing overlay errors.

Referring to FIGS. 1 and 14, at step 110, as mentioned above with respect to FIG. 1, polymeric material 52 may be then be solidified and/or cross-linked, defining patterned layer 68, shown in FIG. 10. Subsequently, at step 112, mold 26 may be separated from patterned layer 68, shown in FIG. 10. To facilitate separation, a shape of patterning device 18 may altered analogous to that mentioned above with respect to FIG. 15 and step 102.

Figure 21:
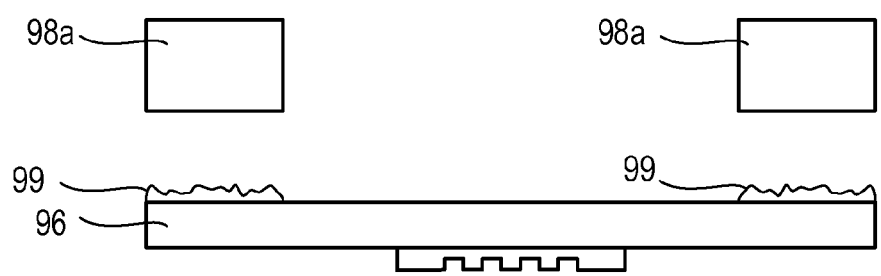
FIG. 21 is a side view of first and second bodies spaced-apart, with the first body having an adhesive composition positioned thereon.
Figure 22:
FIG. 22 is a side view of the first and second bodies shown in FIG. 21, coupled together forming the patterning device, shown in FIG. 2.

Referring to FIGS. 21 and 22, in an example, patterning device 18 may be formed by coupling a first body 96 and second bodies 98a and 98b. More specifically, second bodies 98a and 98b may be coupled to a periphery of first body 96 such that second bodies 98a and 98b define second region 40 of template 20, shown in FIG. 2. Second bodies 98a and 98b may be coupled to first body 96 employing an adhesive material 99, with adhesive material 99 being any coupling composition commonly /employed in the art, with adhesive material 99 that is stiff enough to transmit sheer loads between first body 96 and second bodies 98a and 98b.

Figure 23:
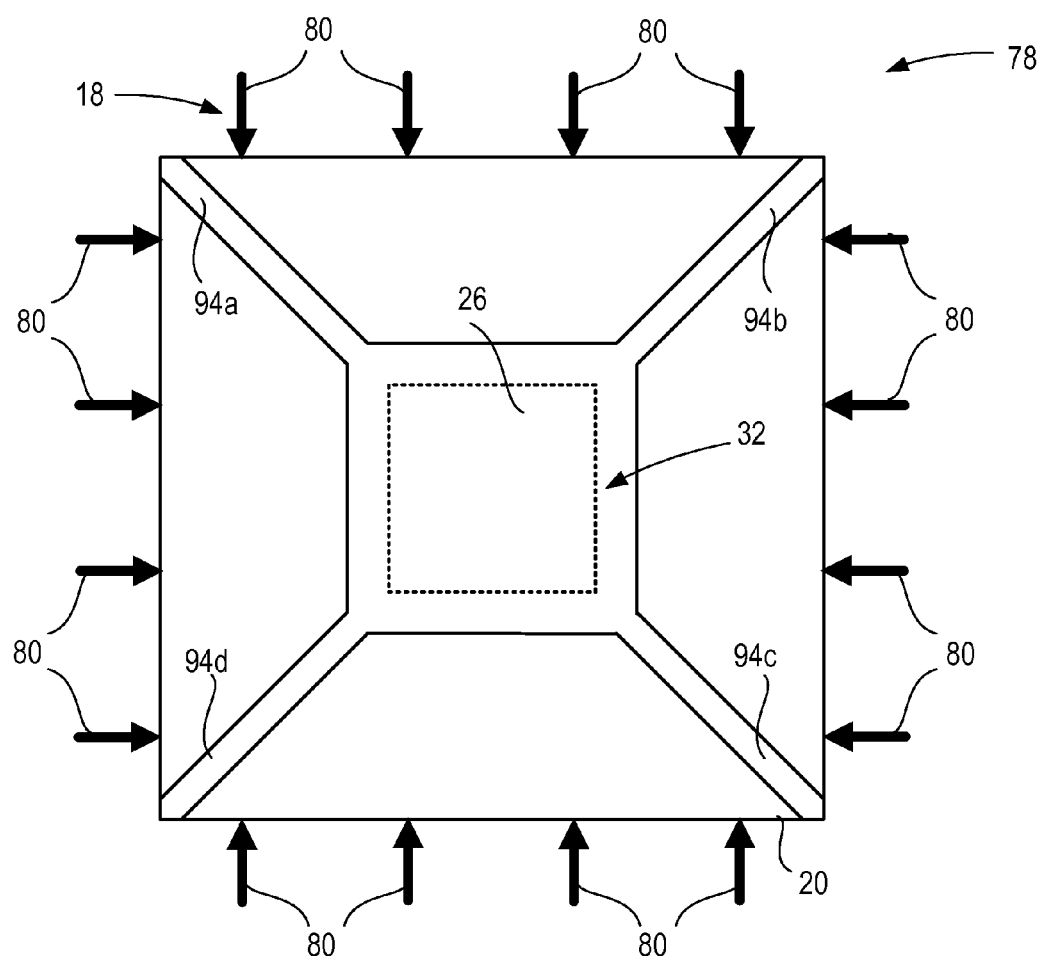
FIG. 23 is a top down view of the patterning device shown in FIG. 2, in a fifth embodiment.
Figure 24:
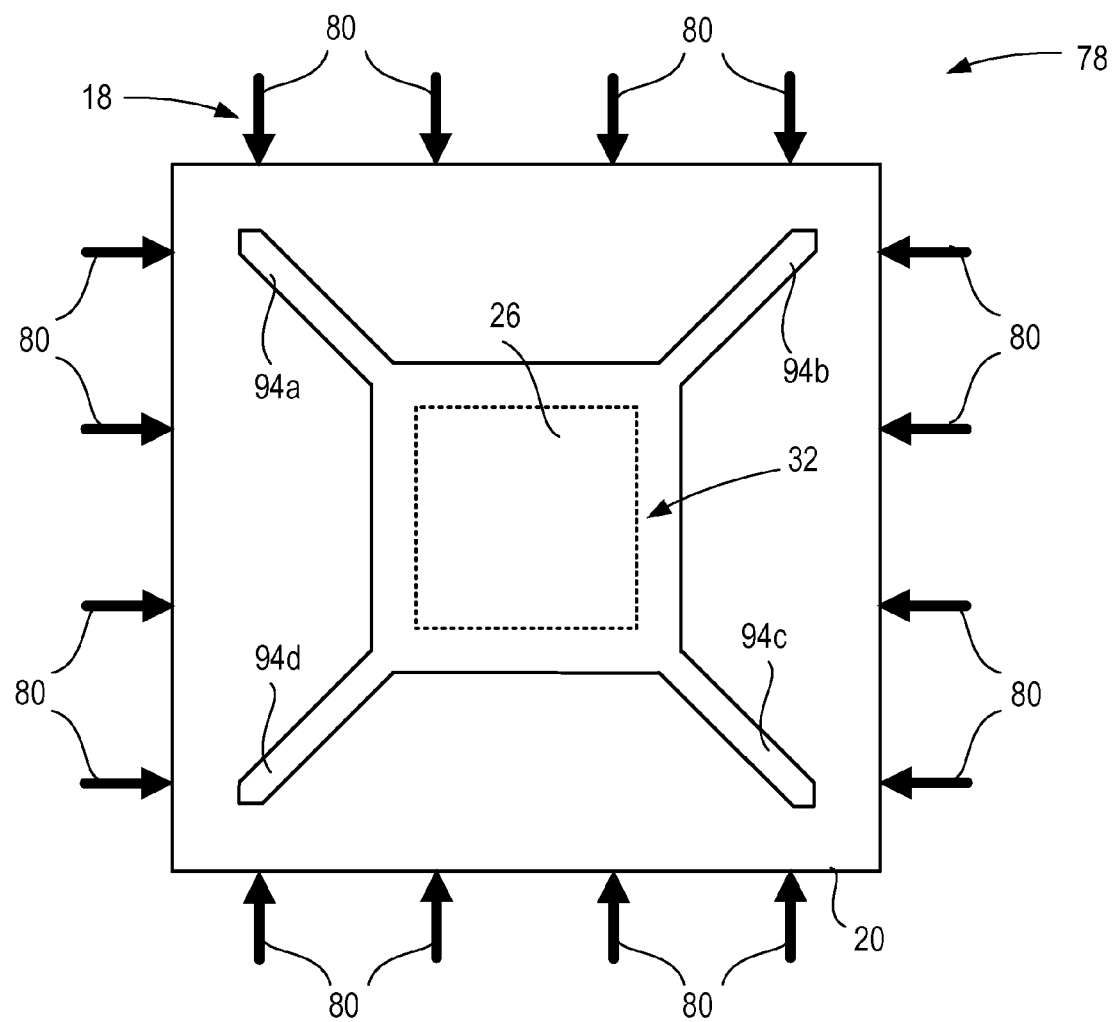
FIG. 24 is a top down view of the patterning device shown in FIG. 2, in a sixth embodiment.

Referring to FIGS. 1, 23, and 24, a further embodiment of patterning device 18 is shown as patterning devices 118 and 218, respectively. Patterning devices 118 and 120 further comprise portions 94a, 94b, 94c, and 94d positioned within second region 40 of template 20, shown in FIG. 2, with portions 94a, 94b, 94c, and 94d having a thickness substantially the same as thickness $t_1$ of first region 38, shown in FIG. 2. Patterning device 118 may be employed were the shape of the same to be altered by application of a plurality of forces by actuators 80. Patterning device 218 may be employed were the shape of the same to be altered by a combination of application of a plurality of forces by actuators 80 and creating a pressure within first chamber 33, shown in FIG. 8. Furthermore, were either patterning device 118 or 120 employed in the above-mentioned process, a vacuum between template chuck 46 and patterning device 118 or 120 may be initially a partial vacuum to facilitate altering a shape of patterning device 118 or 120 and upon completion of altering the shape of patterning device 118 or 120, a full vacuum between template chuck 46 may be employed.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A nanoimprint lithography system comprising:
a template having first and second opposed sides with a first surface disposed on the first side, the second side having a recess disposed therein, the template having a first region and a second region having a perimeter, with the second region surrounding the first region and the recess in superimposition with the first region, with a portion of the first surface in superimposition with the first region being spaced-apart from the second side a first distance and a portion of the first surface in superimposition with the second region being spaced-apart from the second side a second distance, with the second distance being greater than the first distance, the template further having a mold disposed on the first side in superimposition with a portion of the first region and wherein the mold comprises a plurality of protrusions and recessions and the recess is in superimposition with the plurality of protrusions and recessions, and the first region further adapted to bow away from the second side of the template upon application of pressure; and
a pressure control system in fluid communication with the recess configured to apply pressure to the template to bow the first region of the template away from the second side of the template.

2. The system as recited in claim 1 further comprising a template chuck coupled to the template, the template chuck covering the recess to define a chamber in superimposition with the first region.

3. The system of claim 1 further comprising a plurality of actuators coupled to the perimeter of the template to apply a force to the template.

4. The system as recited in claim 3, wherein the forces of the actuators may vary dimensions of the template.

5. The system as recited in claim 1, wherein the recess has a geometric shape selected from a group of geometric shapes consisting of square, rectangular, circular, and elliptical.

6. The system as recited in claim 1, wherein the recess comprises a nadir surface spaced-apart from the first side and the template comprises a boundary surface defined between the nadir surface and the second side, and further comprising additional actuators coupled to the boundary surface.

* * * * *